(12) United States Patent
Song et al.

(10) Patent No.: US 10,930,719 B2
(45) Date of Patent: Feb. 23, 2021

(54) ARRAY SUBSTRATE, METHOD OF MAKING ARRAY SUBSTRATE AND DISPLAY DEVICE HAVING SUB-PIXELS WITH TRANSPARENT ETCHING LAYER

(71) Applicant: BOE Technology Group Co., Ltd., Beijing (CN)

(72) Inventors: Zhen Song, Beijing (CN); Guoying Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/413,843

(22) Filed: May 16, 2019

(65) Prior Publication Data
US 2020/0098841 A1 Mar. 26, 2020

(30) Foreign Application Priority Data
Sep. 25, 2018 (CN) ........................ 2018 1 1115483

(51) Int. Cl.
*H01L 29/08* (2006.01)
*H01L 27/32* (2006.01)

(52) U.S. Cl.
CPC ........ *H01L 27/3258* (2013.01); *H01L 27/322* (2013.01); *H01L 27/3262* (2013.01);
(Continued)

(58) Field of Classification Search
CPC ............... H01L 27/3258; H01L 27/322; H01L 27/3262; H01L 27/3265; H01L 27/3272;
(Continued)

(56) References Cited

U.S. PATENT DOCUMENTS 7,671,528 B2 * 3/2010 Fukuda ............... H01L 51/5284
 313/501
8,063,552 B2 * 11/2011 Cok ....................... H05B 33/22
 313/503
(Continued)

FOREIGN PATENT DOCUMENTS

CN 1921142 A 2/2007
CN 107170762 A 9/2017
(Continued)

OTHER PUBLICATIONS

First Office Action, including Search Report, for Chinese Patent Application No. 201811115483.4, dated Apr. 16, 2020, 17 pages.

*Primary Examiner* — Caleb E Henry
(74) *Attorney, Agent, or Firm* — Westman, Champlin & Koehler, P.A.

(57) ABSTRACT

Embodiments of the present disclosure provide an array substrate, a method for manufacturing an array substrate, a display panel, and a display device. The array substrate includes a plurality of pixels, each of the pixels includes a plurality of sub-pixels, wherein each of the plurality of sub-pixels includes a base substrate, an insulating layer, a color filter layer, a planarization layer, and an organic light emitting unit, and wherein the insulating layer covers the base substrate, the insulating layer is provided with a first opening, at least a portion of the color filter layer is filled in the first opening, the planarization layer covers over the insulating layer and a surface of the color filter layer, and the organic light emitting unit is disposed on the planarization layer.

12 Claims, 3 Drawing Sheets

(52) U.S. Cl.
CPC ...... *H01L 27/3265* (2013.01); *H01L 27/3272* (2013.01); *H01L 2227/323* (2013.01)

(58) Field of Classification Search
CPC ........... H01L 2227/323; H01L 27/3248; H01L 51/5262; H01L 27/3225; H01L 27/3244
USPC .......................................................... 257/40
See application file for complete search history.

(56) References Cited

U.S. PATENT DOCUMENTS

| | | | | |
|---|---|---|---|---|
| 8,174,187 | B2* | 5/2012 | Cok | H01L 51/5268 |
| | | | | 313/506 |
| 2002/0012856 | A1* | 1/2002 | Ohtsu | G02F 1/133514 |
| | | | | 430/7 |
| 2005/0116619 | A1* | 6/2005 | Kuma | H01L 51/5036 |
| | | | | 313/503 |
| 2005/0194896 | A1* | 9/2005 | Sugita | B82Y 30/00 |
| | | | | 313/506 |
| 2015/0295094 | A1* | 10/2015 | Ren | H01L 21/02532 |
| | | | | 257/66 |
| 2017/0084669 | A1* | 3/2017 | Wolk | H01L 27/322 |
| 2017/0345882 | A1* | 11/2017 | Nam | H01L 27/3246 |
| 2018/0123086 | A1* | 5/2018 | Oh | H01L 27/3262 |
| 2018/0151120 | A1* | 5/2018 | Kim | G09G 3/3258 |
| 2019/0220644 | A1 | 7/2019 | Sun et al. | |

FOREIGN PATENT DOCUMENTS

| | | |
|---|---|---|
| CN | 108242462 A | 7/2018 |
| JP | S63119569 A | 5/1988 |

* cited by examiner

ARRAY SUBSTRATE, METHOD OF MAKING ARRAY SUBSTRATE AND DISPLAY DEVICE HAVING SUB-PIXELS WITH TRANSPARENT ETCHING LAYER

CROSS-REFERENCE TO RELATED APPLICATION

This application claims priority of Chinese Patent Application No. 201811115483.4 filed on Sep. 25, 2018 in China National Intellectual Property Administration, the disclosure of which is incorporated herein by reference in entirety.

TECHNICAL FIELD

Embodiments of the present disclosure relate to the field of display technology, and in particular, to an array substrate, a method for manufacturing an array substrate, a display panel, and a display device.

BACKGROUND

Organic Light Emitting Diode (OLED) display devices have various advantages such as white light emission, low driving voltage, high luminous efficiency, short response time, high definition and contrast ratio, nearly 180° viewing angle, wide working temperature range, flexible display and large-area full-color display, and so on, and therefore they are recognized as the most promising display devices by the industry.

Among them, the contrast ratio is an important parameter of OLED, and a higher contrast ratio can give users a good visual experience. The contrast ratio of the display device refers to a value obtained by dividing a brightness of a white picture (in a brightest state) by a brightness of a black picture (in a darkest state). It can be seen that increasing the maximum display brightness is of great significance for improving the contrast ratio.

SUMMARY

In a first aspect, some embodiments of the present disclosure provide an array substrate comprising a plurality of pixels, each of the pixels comprising a plurality of sub-pixels, wherein each of the plurality of sub-pixels comprises a base substrate, an insulating layer, a color filter layer, a planarization layer, and an organic light emitting unit, and wherein the insulating layer covers the base substrate, the insulating layer is provided with a first opening, at least a portion of the color filter layer is filled in the first opening, the planarization layer covers over the insulating layer and a surface of the color filter layer, and the organic light emitting unit is disposed on the planarization layer.

According to some embodiments of the present disclosure, the first opening extends through the insulating layer.

According to some embodiments of the present disclosure, the first opening extends into the insulating layer but does not extend through the insulating layer.

According to some embodiments of the present disclosure, each of the plurality of sub-pixels further comprises a transparent etching barrier layer between the color filter layer and the base substrate.

According to some embodiments of the present disclosure, each of the plurality of sub-pixels further comprises a light shielding layer covering the base substrate, and a top gate thin film transistor, the top gate thin film transistor comprising a gate electrode, a source electrode, a drain electrode, an active layer and a gate insulating layer.

According to some embodiments of the present disclosure, each of the plurality of sub-pixels further comprises a pixel capacitor, the pixel capacitor comprising a first electrically conductive layer and a second electrically conductive layer;

wherein the first electrically conductive layer covers the base substrate, the first electrically conductive layer is electrically connected to the drain electrode, and first electrically conductive layers of two adjacent ones of the plurality of sub-pixels are insulated from each other; and wherein the second electrically conductive layer and the drain electrode cover a same layer, and the second electrically conductive layer is electrically connected to the gate electrode.

According to some embodiments of the present disclosure, the light shielding layer covers the first electrically conductive layer and is electrically connected to the first electrically conductive layer, and the light shielding layer is electrically connected to the drain electrode.

According to some embodiments of the present disclosure, each of the plurality of sub-pixels further comprises a passivation layer covering surfaces of the source electrode, the drain electrode and the second electrically conductive layer; and the insulating layer comprises a buffer layer and the passivation layer, the buffer layer covering a surface of the light shielding layer, the planarization covering the passivation layer.

According to some embodiments of the present disclosure, the organic light emitting unit comprises a transparent electrode, at least a portion of the transparent electrode covering the planarization layer, the transparent electrode being electrically connected to the first electrically conductive layer, the transparent electrode comprising a first region, and wherein an orthographic projection of the first region on the base substrate at least partially overlaps with an orthographic projection of the second electrically conductive layer on the base substrate.

According to some embodiments of the present disclosure, the planarization layer is provided with a second opening extending through the planarization layer, and the first region covers the passivation layer and is located in the second opening.

According to some embodiments of the present disclosure, the organic light emitting unit further comprises an organic light emitting layer disposed on the transparent electrode and an electrode disposed on the organic light emitting layer.

According to some embodiments of the present disclosure, the insulating layer comprises a buffer layer, an interlayer dielectric layer covering the buffer layer, and a passivation layer covering the interlayer dielectric layer, and wherein a first sub-opening is provided in the buffer layer, a second sub-opening is provided in the interlayer dielectric layer, and a third sub-opening is provided in the passivation layer.

In a second aspect, some embodiments of the present disclosure provide a display panel, comprising the array substrate according to the first aspect.

In a third aspect, some embodiments of the present disclosure provide a display device, comprising the display panel according to the second aspect.

In a fourth aspect, some embodiments of the present disclosure provide a method for manufacturing an array substrate, comprising:

providing a base substrate;

forming an insulating layer on the base substrate;

forming a first opening in the insulating layer;

forming a color filter layer such that at least a portion of the color filter layer is filled in the first opening;

forming a planarization layer on the insulating layer to cover a surface of the color filter layer; and forming an organic light emitting unit on the planarization layer.

According to some embodiments of the present disclosure, before forming the insulating layer on the base substrate, the method further comprises:

applying a conductive film on the base substrate and patterning the conductive film to form first electrically conductive layers, wherein the first electrically conductive layers located in two adjacent sub-pixel regions are spaced apart from each other; and applying a light shielding film on the base substrate and patterning the light shielding film to form a light shielding layer.

According to some embodiments of the present disclosure, the forming an insulating layer on the base substrate comprises:

forming a buffer layer on the base substrate to cover surfaces of the first electrically conductive layer and the light shielding layer;

forming a top gate thin film transistor on the buffer layer, wherein the top gate thin film transistor comprises a gate electrode, a source electrode, a drain electrode, an active layer and a gate insulating layer, the drain electrode being electrically connected to the first electrically conductive layer through a first via hole;

forming a second electrically conductive layer over the interlayer dielectric layer covered by the source electrode and the drain electrode, so that the second electrically conductive layer and the first electrically conductive layer form a pixel capacitor therebetween; and forming a passivation layer on the interlayer dielectric layer to cover surfaces of the source electrode, the drain electrode, and the second electrically conductive layer, wherein the insulating layer comprises the buffer layer, the interlayer dielectric layer, and the passivation layer.

According to some embodiments of the present disclosure, the forming an organic light emitting unit on the planarization layer comprises:

forming a second via hole, which extends through the planarization layer, the passivation layer and the interlayer dielectric layer, and is in communication with the first electrically conductive layer;

forming a transparent electrode, at least a portion of which is located on the planarization layer, such that the transparent electrode is electrically connected to the first electrically conductive layer through the second via hole, and an orthographic projection of a first region of the transparent electrode on the base substrate at least partially overlaps with an orthographic projection of the second electrically conductive layer on the base substrate.

According to some embodiments of the present disclosure, the forming the transparent electrode comprises:

forming a second opening, which extends through the planarization layer, in the planarization layer; and forming the transparent electrode such that the first region covers the passivation layer and is located within the second opening.

According to some embodiments of the present disclosure, before forming the insulating layer on the base substrate, the method further comprises:

forming a transparent etching barrier layer on the base substrate.

BRIEF DESCRIPTION OF THE DRAWINGS

In order to more clearly illustrate the technical solutions in the embodiments of the present disclosure or in the related art, the accompanying drawings to be used in the description of the embodiments of the present disclosure or in the related art will be briefly described below. It is obvious that the drawings in the following description only reflect some embodiments of the present disclosure, and other drawings may also be obtained by those skilled in the art based on these drawings without any creative efforts.

DETAILED DESCRIPTION OF EMBODIMENTS

Figure 1:
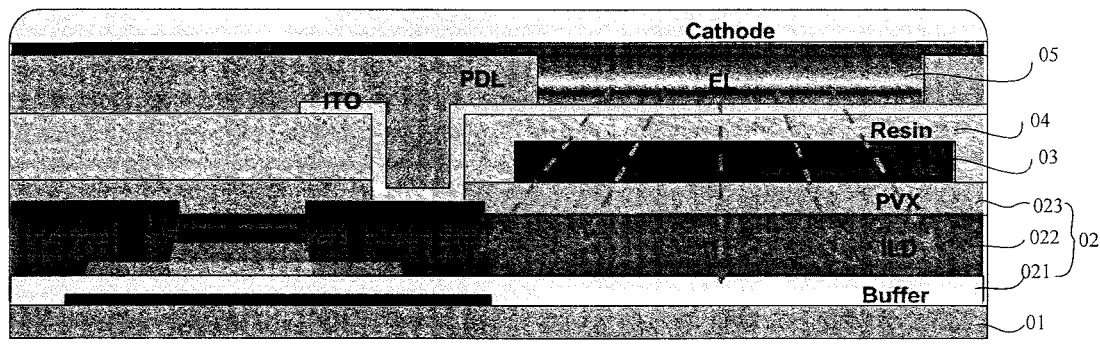
FIG. 1 is a schematic structural view of a sub-pixel in an array substrate in the related art.

The technical solutions in the embodiments of the present disclosure will be clearly and completely described below with reference to the accompanying drawings in the embodiments of the present disclosure. It is obvious that the described embodiments represent a part of the present disclosure, but not all of the embodiments. All other embodiments obtained by those skilled in the art based on the embodiments of the present disclosure without any creative efforts fall within the scope of the present disclosure.

In the description of the present disclosure, it is to be understood that the terms "center", "upper", "lower", "front", "rear", "left", "right", "vertical", "horizontal", "top", "bottom", "inner", "outer" and the like, which indicate orientation or positional relationships, are understood based on the orientation or positional relationships shown in the drawings, they are merely used for the convenience of describing the present disclosure and simplifying the description, rather than indicating or implying that the device or component referred to must have a particular orientation, and be constructed and operated in a particular orientation, and therefore they should not be construed as limiting the present disclosure.

In the description of the present disclosure, it should be noted that the terms "install", "couple", and "connect" should be understood broadly, and may for example refer to a fixed connection, or a detachable connection, or an integral connection, unless otherwise explicitly specified and defined. The specific meanings of the above terms in the present disclosure should be understood by those skilled in the art according to the specific conditions.

The terms "first" and "second" are only used for the purpose of description and should not be construed as indicating or implying a relative importance or implicitly indicating the number of technical features referred to. Thus, the feature defined by "first" or "second" may include one or more said features either explicitly or implicitly. In the description of the present disclosure, the expression "a plurality of" means two or more unless otherwise stated.

An array substrate of an OLED according to the related art is shown in FIG. 1, it includes a plurality of pixels, and each of the pixels includes a plurality of sub-pixels. For each sub-pixel, it includes a base substrate 01, an insulating layer 02, a color filter layer 03, a planarization layer 04, and an organic light emitting unit 05 arranged in a thickness direction of the array substrate perpendicular to the array substrate.

For the array substrate in the related art, in operation, the light emitted by an organic light emitting unit 05 needs to pass through the planarization layer 04, the color filter layer 03, the insulating layer 02 (for example, a passivation layer 023, a interlayer dielectric layer 022 and a buffer layer 021 shown in FIG. 1) and other film layers. The brightness of the light emitted by the organic light emitting unit 05 is attenuated due to the absorption of the light emitted by the organic light emitting unit 05 by the various film layers, thus it is unfavorable for improving the display brightness of the OLED.

The embodiments of the present disclosure provide an array substrate, a method for manufacturing the same, a display panel, and a display device for solving the problem that the brightness of the light emitted by the organic light emitting unit in the array substrate in the related art is greatly attenuated.

Figure 2:
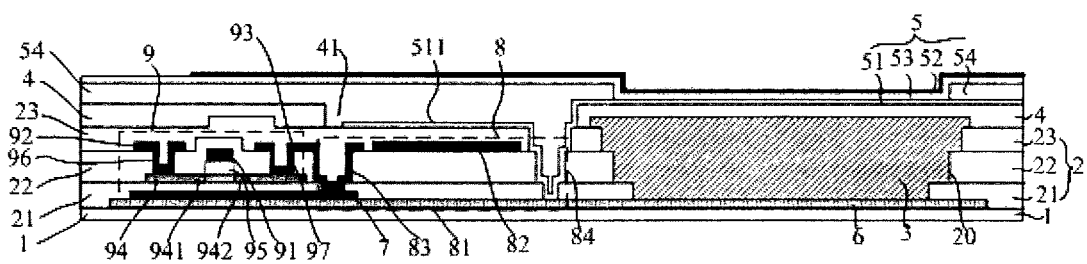
FIG. 2 is a schematic structural view of a sub-pixel in an array substrate according to an embodiment of the present disclosure.

In a first aspect, an embodiment of the present disclosure provides an array substrate including a plurality of pixels, and each of the pixels includes a plurality of sub-pixels. For each sub-pixel, as shown in FIG. 2, it includes a base substrate 1, an insulating layer 2, a color filter layer 3, a planarization layer 4, and an organic light emitting unit 5. The insulating layer 2 covers the base substrate 1, the insulating layer 2 is provided with a first opening 20, at least a portion of the color filter layer 3 (CF layer) is filled in the first opening 20, the planarization layer 4 covers the insulating layer 2 and a surface of the color filter layer 3, and the organic light emitting unit 5 is disposed on the planarization layer 4.

The color filter layer 3 may be partially located in the first opening 20 (for example as shown in FIG. 2), or may be completely located in the first opening 20. It will not be specifically limited herein.

Figure 3:
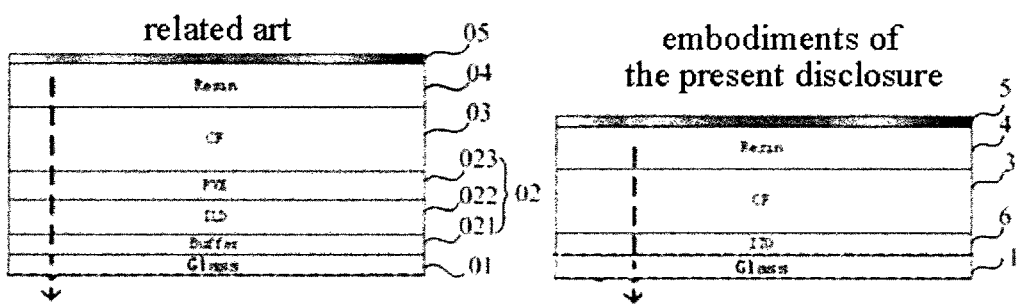
FIG. 3 is a schematic view showing a structure comparison between a sub-pixel in an array substrate according to an embodiment of the present disclosure and a sub-pixel in an array substrate in the related art.

In the array substrate provided by the embodiments of the present disclosure as shown in FIG. 2 and FIG. 3, since the insulating layer 2 is provided with a first opening 20, and at least a portion of the color filter layer 3 is filled in the first opening 20, a height difference between the color filter layer 3 and the base substrate 1 is reduced in case where the thickness of the color filter layer 3 is constant, and at least a portion of the color filter layer 3 is overlapped with the insulating layer 2, thereby greatly reducing the height of the color filter layer 3 protruding from the insulating layer 2. In this case, it is unnecessary to make the planarization layer 4 too thick, to cover the surface of the color filter layer 3 protruding from the surface of the insulating layer 2, thus the thickness of the planarization layer 4 can be greatly reduced. The reduction of the thickness of the planarization layer 4 can effectively shorten the light exit path of the light emitted from the organic light emitting unit 5, and reduce the absorption of the light emitted by the organic light emitting unit 5 by respective film layers, thereby facilitating the improvement of the highest brightness of the light emitted by the organic light emitting unit 5, and further facilitating the improvement of the contrast ratio of the display device and allowing the user to obtain a better visual experience.

In the above embodiments, the forms of the first opening 20 are various. For example, the first opening 20 may extend through the insulating layer 2, as shown in FIG. 2, the insulating layer 2 includes a buffer layer 21 covering the base substrate 1, an interlayer dielectric layer 22 (ILD) covering the buffer layer 21, and a passivation layer 23 (PVX) covering the interlayer dielectric layer 22, and the first opening 20 extends through the buffer layer 21, the interlayer dielectric layer 22 and the passivation layer 23. Alternatively, the first opening 20 may not extend through the whole insulating layer 2, for example, the first opening 20 may extend through the interlayer dielectric layer 22 and the passivation layer 23. Compared with the arrangement that the first opening does not extend through the insulating layer 2, the arrangement that the first opening 20 extends through the insulating layer 2 has the following advantages: (1) in case where the thickness of the color filter layer 3 is constant, the arrangement that the first opening extends through the insulating layer 2 can further reduce the height difference between the color filter layer 3 and the base substrates 1, further reduce the height of the color filter layer 3 protruding from the insulating layer 2, and thus further reduce the thickness of the planarization layer 4, shorten the light exit path of the light emitted from the organic light emitting unit 5, thereby facilitating the further improvement of the highest brightness of the light emitted from the organic light emitting unit 5; (2) it reduces the number of insulating sub-layers through which the light emitted by an organic light emitting layer 53 passes, for example the light emitted by the organic light emitting layer 53 shown in FIG. 2 just needs to pass through the planarization layer 4 and the color filter layer 3, thus it avoids the light emitted from the organic light emitting layer 53 from being absorbed, refracted when the light passes through different insulating sub-layers (for example, the interlayer dielectric layer 22, the buffer layer 21, the passivation layer 23), thereby the brightness of the light emitted from the organic light emitting unit 5 can be increased.

In order to avoid the base substrate 1 from being etched when the first opening 20 is formed, as shown in FIG. 2, the sub-pixel further includes a transparent etching barrier layer 6 located between the color filter layer 3 and the base substrate 1. In this way, when the first opening 20 is formed by etching (for example, a dry etching process) the insulating layer 2, the transparent etching barrier layer 6 can protect the base substrate 1 covered thereby to avoid the base substrate 1 from being etched.

The transparent etching barrier layer 6 may be an ITO layer. The first opening 20 is generally formed by dry etching. Since the ITO layer is not affected by the dry etching, the ITO layer can serve as blocking the base substrate 1 from being etched. In order to reduce the absorption of the light emitted from the organic light emitting layer 53, the thickness of the ITO layer could be made as small as possible while satisfying the etching barrier function.

As shown in FIG. 2, the sub-pixel further includes a light shielding layer 7 (SH layer) covering the base substrate 1, a buffer layer 21 covering the base substrate 1 and a surface of the light shielding layer 7, and a top gate thin film transistor 9 disposed on the buffer layer 21. The top gate thin film transistor 9 includes a gate electrode 91, a source electrode 92 and a drain electrode 93.

The sub-pixel further includes a pixel capacitor 8 including a first electrically conductive layer 81 and a second electrically conductive layer 82. The first electrically conductive layer 81 and the second electrically conductive layer 82 may be arranged in various forms, for example, they may be arranged in the following manner: as shown in FIG. 2, the first electrically conductive layer 81 covers the base substrate 1 and is located in the buffer layer 21, the first electrically conductive layer 81 is electrically connected to the drain electrode 93 through a first via hole 83, and first electrically conductive layers 81 of two adjacent sub-pixels are insulated from each other; the second electrically conductive layer 82 and the drain electrode 93 cover the same insulating layer (for example, the interlayer dielectric layer 22 shown in FIG. 2), and the second electrically conductive layer 82 is electrically connected to the gate electrode 91 of the top gate thin film transistor 9. Alternatively, they may be arranged in the following manner: an electrically conducted region of an active layer 94 is used as the first electrically conductive layer 81, the second electrically conductive layer 82 and the drain electrode 93 covers the same insulating layer 2, and the second electrically conductive layer 82 is electrically connected to the gate electrode 91 of the top gate thin film transistor 9. Compared to the embodiment in which the electrically conducted region of the active layer 94 is used as the first electrically conductive layer 81, the embodiment shown in FIG. 2 has the following advantages: (1) It is not necessary to use the electrically conducted region of the active layer 94 as an electrode plate (Vs) of the pixel capacitor 8 and signal wires, thereby reducing the difficulty of electrically conducting the active layer 94; (2) It prevents the problem that a parasitic resistance of the first electrically conductive layer 81 is large due to incomplete electrical conducting of the active layer 94, thereby the performance of storing charges of the pixel capacitor 8 may be improved; (3) The area of the electrically conducted region of the active layer 94 is reduced, so that it is not necessary to make a large-area light shielding layer 7 on the base substrate 1 to shield the active layer 94 from light, the light shielding can be realized by using the light shielding layer 7 of a smaller area, so that the light shielding layer 7 of a smaller area can reduce the affection of the temperature rise of the light shielding layer 7 on the active layer 94 in subsequent high temperature processes (e.g., an annealing process of the active layer 94), that is, avoiding the thin film transistor from being unable to be turned off due to over-annealing of the active layer 94; at the same time, the light shielding layer 7 of a smaller area may also reduce the reflection of the light emitted from the organic light emitting layer 53 to the active layer 94, thereby reducing any adverse affection on the characteristics of thin film transistors.

The positional relationship between the light shielding layer 7 and the first electrically conductive layer 81 may vary. For example, as shown in FIG. 2, the light shielding layer 7 may cover the first electrically conductive layer 81 from above and be electrically connected to the first electrically conductive layer 81, and the light shielding layer 7 is electrically connected to the drain electrode 93 through the first via hole 83. Alternatively, the first electrically conductive layer 81 may also cover the light shielding layer 7 from above and be electrically connected to the light shielding layer 7, and the first electrically conductive layer 81 is directly electrically connected to the drain electrode 93 through the first via hole 83. Compared with the embodiment in which the first electrically conductive layer 81 covers the light shielding layer 7 from above, the embodiment in which the light shielding layer 7 covers the first electrically conductive layer 81 from above can prevent the light shielding layer 7 from contacting the base substrate 1, and solve the problem that the light shielding layer 7 and the base substrate 1 have poor adhesion and optional materials thereof are limited (this is because the light shielding layer 7 is generally made of metal, the base substrate 1 is generally made of glass, and the adhesion between the metal layer and the glass substrate is relatively poor), thereby the range of optional materials of the light shielding layer 7 can be greatly extended, and the tolerance of the process can be broadened.

In the pixel capacitor 8, the first electrically conductive layer 81 may be an ITO layer. Thus, in the case where the transparent etching barrier layer 6 is an ITO layer, the first electrically conductive layer 81 and the transparent etch barrier layer 6 may be integrally formed by one process. This can simplify the production process and reduce the production cost.

As shown in FIG. 2, the top gate thin film transistor 9 includes an active layer 94 covering the buffer layer 21, a gate insulating layer 95 covering the active layer 94, a gate electrode 91 covering the gate insulating layer 95, an interlayer dielectric layer 22 covering the surfaces of the active layer 94, the gate insulating layer 95 and the gate electrode 91, and a source electrode 92 and a drain electrode 93 both covering the interlayer dielectric layer 22.

As shown in FIG. 2, the sub-pixel further includes a passivation layer 23 covering the surfaces of the source electrode 92, the drain electrode 93, and the second electrically conductive layer 82. The insulating layer 2 includes the buffer layer 21 and the passivation layer 23, and the planarization layer 4 covers the passivation layer 23.

As shown in FIG. 2, the organic light emitting unit 5 includes a transparent electrode 51, at least a portion of which covers the planarization layer 4, and the transparent electrode 51 is electrically connected to the first electrically conductive layer 81 through a second via hole 84. The transparent electrode 51 includes a first region 511, and an orthographic projection of the first region 511 on the base substrate 1 and an orthographic projection of the second electrically conductive layer 82 on the base substrate 1 at least partially overlap with each other. Since the transparent electrode 51 is electrically connected to the first electrically conductive layer 81 through the second via hole 84, an electrical signal outputted from the drain electrode 93 of the thin film transistor can be transmitted to the transparent electrode 51 through the first via hole 83, the first electrically conductive layer 81 and the second via hole 84, so as to drive the organic light emitting layer 53 to emit light. Since the orthographic projection of the first region 511 on the base substrate 1 and the orthographic projection of the second electrically conductive layer 82 on the base substrate 1 at least partially overlap with each other, a capacitor is formed between the first region 511 of the transparent electrode 51 and the second electrically conductive layer 82, thereby increasing a charge storage capability of the pixel capacitor 8, ensuring that the voltage on the transparent electrode 51 is more stable during the operation of the array substrate, and ensuring the display quality of the display device.

Of course, in addition to the transparent electrode 51 being electrically connected to the first electrically conductive layer 81 through the second via hole 84 to achieve the electrical connection of the transparent electrode 51 with the drain electrode 93, the transparent electrode 51 may also be directly electrically connected to the drain electrode 93 through the second via hole 84.

The arrangement mode of the first region 511 of the transparent electrode 51 may vary. For example, the following arrangement mode may be adopted: as shown in FIG. 2, the planarization layer 4 is provided with a second opening 41 extending through the planarization layer 4, the first region 511 covers the passivation layer 23 and is located within the second opening 41. Alternatively, the following arrangement mode may be adopted: there is no second opening 41 formed in the planarization layer 4, and the first region 511 covers the planarization layer 4 from above. Compared with the embodiment in which the first region 511 covers the planarization layer 4 from above, the embodiment in which the first region 511 covers the passivation layer 23 from above and is located within the second opening 41 allows the distance between the first region 511 and the second electrically conductive layer 82 to be reduced, so that the capacitance between the first region 511 and the second electrically conductive layer 82 may be increased, to further increase the capacitance of the pixel capacitor 8, thereby further increasing the charge storage capability of the pixel capacitor 8, and ensuring that the voltage on the transparent electrode 51 is more stable during the operation of the array substrate.

For the array substrate provided by the embodiments of the present disclosure, the thin film transistor may be a bottom gate structure in addition to the top gate structure, which is not specifically limited herein. The thin film transistor may be an amorphous silicon thin film transistor, an oxide thin film transistor, a low temperature polysilicon thin film transistor or the like, which is not specifically limited herein. Herein, the thin film transistor of a bottom gate structure may be of a back channel type, an etching barrier type, a coplanar type or the like.

In the array substrate provided by the embodiments of the present disclosure, the material of the active layer 94 of the thin film transistor includes any one of a-IGZO, ZnON, IZTO, a-Si, p-Si, sexithiophene, or polythiophene; the materials of the electrodes and the lines may be commonly used metal materials, such as Ag, Cu, Al, Mo, etc., or multilayer of metals, such as MoNb/Cu/MoNb, etc., or alloy materials of the above metals, such as AlNd, MoNb, etc., a stacked structure of metal and transparent conductive oxide (such as ITO, AZO, etc.), for example, Mo/AlNd/ITO, ITO/Ag/ITO, etc.

In the array substrate provided by the embodiments of the present disclosure, the insulating layer, such as the gate insulating layer 95, the interlayer dielectric layer 22, the passivation layer 23, the buffer layer 21, and the planar layer 4, may be made of the conventional dielectric material, such as SiOx, SiNx, SiON, etc., or various new organic insulating materials, or a high dielectric constant (High k) material, such as AlOx, HfOx, TaOx, etc. The organic insulating dielectric material of the planarization layer 4 may be polysiloxane, acrylic, polyimide or the like.

In a second aspect, an embodiment of the present disclosure provides a display panel including the array substrate described in the first aspect.

The display panel may be applied to a bottom-emitting OLED display panel manufactured based on an oxide technology, a silicon technology, or an organic technology.

The display panel provided by the embodiments of the present disclosure solves the same technical problem and achieves the same technical effect as the array substrate described in the first aspect, because the array substrate included in the display panel is the same as the array substrate described in the first aspect.

Other structures in the display panel are well known to those skilled in the art and will not be described herein.

In a third aspect, an embodiment of the present disclosure provides a display device including the display panel described in the second aspect.

The display device provided by the embodiments of the present disclosure solves the same technical problem and achieves the same technical effect as the array substrate described in the first aspect.

Other structures in the display device are well known to those skilled in the art and will not be described herein.

Figure 4:
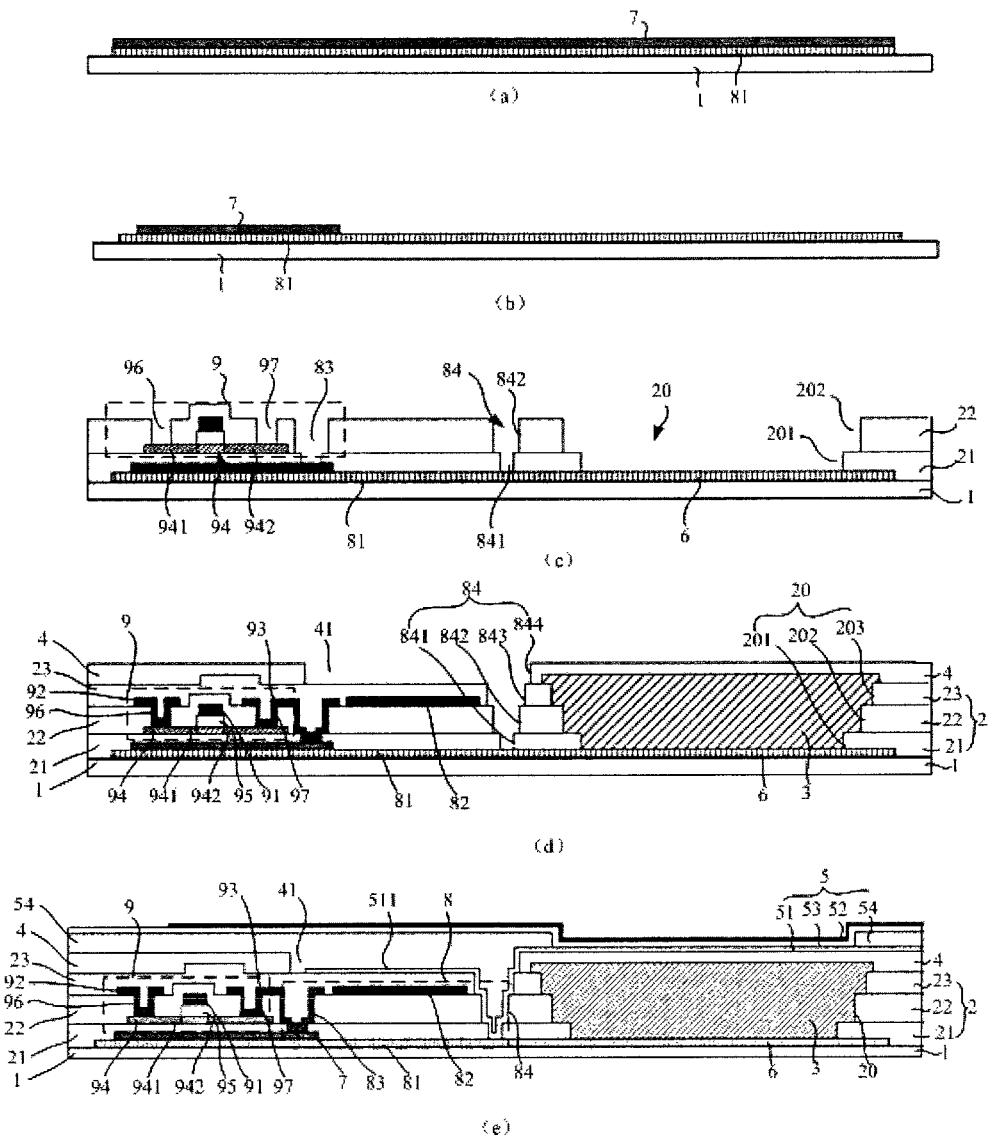
FIG. 4 is a schematic view showing a process for manufacturing an array substrate according to an embodiment of the present disclosure.
Figure 5:
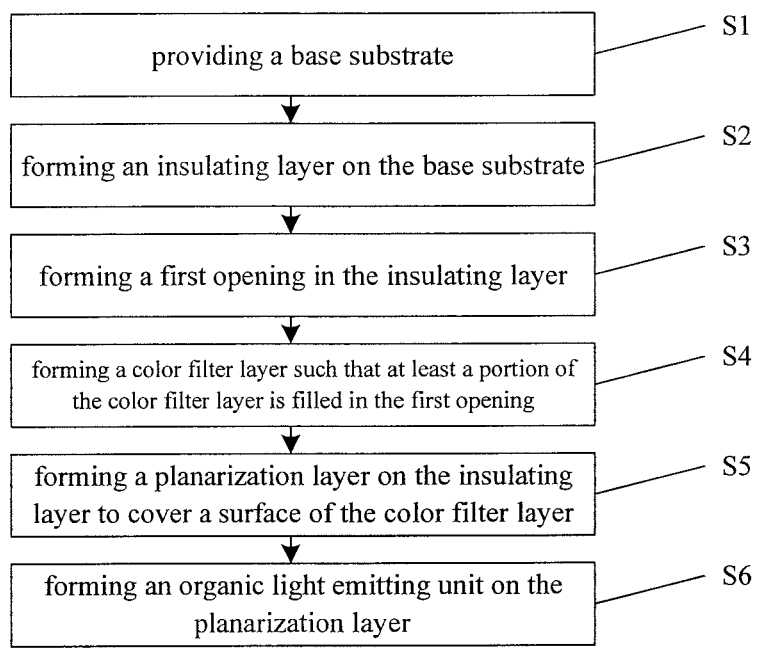
FIG. 5 is a flow chart of a process for manufacturing an array substrate according to an embodiment of the present disclosure.

In a fourth aspect, an embodiment of the present disclosure provides a method for manufacturing an array substrate, including the following steps:

Step S1: providing a base substrate 1, as shown in FIG. 4(*a*).

The base substrate 1 may be cleaned before the insulating layer 2 is formed on the base substrate 1, to remove solid particles on the base substrate 1, so as to avoid adverse effects on the subsequent processes; the base substrate 1 may be a glass substrate, a sapphire substrate, a silicon substrate, or the like.

Step S2: forming an insulating layer 2 on the base substrate 1.

As shown in FIG. 2, the insulating layer 2 includes a buffer layer 21, an interlayer dielectric layer 22, and a passivation layer 23. As shown in FIGS. 4(*c*) and 4(*d*), the formation process of the insulating layer 2 may refer to: forming the buffer layer 21 on the base substrate 1; forming the interlayer dielectric layer 22 on the buffer layer 21; forming the passivation layer 23 on the interlayer dielectric layer 22.

The insulating layer 2 may be directly formed on the base substrate 1, as shown in FIG. 4(*d*), or a transparent etching barrier layer 6 (for example, an ITO layer) may be first formed on the base substrate 1, and then the insulating layer 2 is formed on the transparent etching barrier layer 6, so that the base substrate 1 is avoided from being etched when the first opening 20 is formed.

Step S3: forming a first opening 20 in the insulating layer 2.

When the insulating layer 2 includes a plurality of insulating sub-layers, for example, the insulating layer 2 includes a buffer layer 21, an interlayer dielectric layer 22 and a passivation layer 23, the first opening 20 may be formed by one-time etching after the plurality of insulating sub-layers are formed, or the first opening 20 may be formed by forming sub-openings in respective insulating sub-layers, i.e., a sub-opening is formed in each insulating sub-layer once this sub-insulating layer is formed, and then the sub-openings of the plurality of sub-insulating layers are combined to form the first opening 20; for example, as shown in FIGS. 4(*c*) and 4(*d*), the first opening 20 may be formed by: forming a buffer layer 21 on the base substrate 1 and forming a first sub-opening 201 in the buffer layer 21; forming an interlayer dielectric layer 22 on the buffer layer 21 and forming a second sub-opening 202 in the interlayer dielectric layer 22; forming a passivation layer 23 on the interlayer dielectric layer 22 and forming a third sub-opening 203 in the passivation layer 23; combining the sub-opening 201, the second sub-opening 202, and the third sub-opening 203 to form the first opening 20.

Step S4: forming a color filter layer 3 such that at least a portion of the color filter layer 3 is filled in the first opening 20.

The color filter layer 3 includes color filter sub-layers of different colors, including three colors of R, G and B, and at least a portion of the color filter sub-layer portion of each color is disposed in the first opening 20 of a corresponding one of the three sub-pixels.

Step S5: forming a planarization layer 4 on the insulating layer 2 to cover a surface of the color filter layer 3.

Step S6: forming an organic light emitting unit 5 on the planarization layer 4, as shown in FIG. 4(*e*).

As shown in FIG. 4(*e*), the organic light emitting unit 5 includes a transparent electrode 51 (anode), a cathode 52, and an organic light emitting layer 53 located therebetween. In each of the sub-pixels, an orthographic projection of the organic light emitting layer 53 of the organic light emitting unit 5 on the base substrate 1 overlaps with an orthographic projection of the first opening 20 on the base substrate 1.

The method for manufacturing the array substrate provided by the embodiments of the present disclosure can solve the same technical problem and achieve the same technical effect as the array substrate described in the first aspect, which will not be repeatedly described herein.

In the above method for manufacturing the array substrate, the manufacturing process of the thin film transistor is an important component of the method. Hereinafter, the oxide thin film transistor is taken as an example to illustrate the manufacturing process of the thin film transistor and the insulating layer 2:

Step S21: applying a conductive film on the base substrate 1 and patterning the conductive film to form first electrically conductive layers 81.

The first electrically conductive layers 81 located in two adjacent sub-pixel regions are spaced apart from each other, so that the first electrically conductive layer can transmit the electrical signal outputted by the drain electrode 93 of the thin film transistor in each sub-pixel to the transparent electrode 51 of the organic light emitting unit 5.

The conductive film may be applied on the base substrate 1 by a sputtering process, and the material of the conductive film may be a transparent conductive oxide, such as an ITO film, an AZO film or the like.

The patterning of the conductive film is completed by a photolithography process;

Step S22: applying a light shielding film on the base substrate 1 and patterning the light shielding film to form a light shielding layer 7, as shown in FIGS. 4(*a*) and 4(*b*).

The light shielding layer 7 is mainly used for shielding the active layer 94 to prevent the external light from being irradiated onto the active layer 94, otherwise the irradiation of the external light to the active layer would cause the active layer 94 to generate photo-generated carriers, thereby affecting the performance of the thin film transistor. The light shielding layer 7 may be made of a light-transmissive metal or a metal alloy;

The first electrically conductive layer 81 may be first formed on the base substrate 1, and then the light shielding layer 7 is formed, wherein the light shielding layer 7 covers the first electrically conductive layer 81 from above (as shown in FIG. 4(*b*)); or alternatively, the light shielding layer 7 may be first formed on the base substrate 1, and then the first electrically conductive layer 81 is formed, wherein the first electrically conductive layer 81 covers the light shielding layer 7 from above.

Step S23: forming a buffer layer 21 on the base substrate 1 to cover surfaces of the first electrically conductive layer 81 and the light shielding layer 7, as shown in FIG. 4(*c*).

The buffer layer 21 may be of a SiO$_2$ single layer structure or a SiNx/SiO$_2$ double-layer structure, which is not specifically limited herein.

The buffer layer 21 serves as blocking impurities in the base substrate 1 from diffusing into the active layer 94 to avoid affecting the electrical performance of the thin film transistor; the buffer layer 21 may be formed on the base substrate 1 by PECVD (Plasma Enhanced Chemical Vapor Deposition).

Step S24: forming a top gate thin film transistor 9 on the buffer layer 21, as shown in FIGS. 4(*c*) and 4(*d*), wherein the top gate thin film transistor 9 includes a source electrode 92 and a drain electrode 93, and the drain electrode 93 is electrically connected to the first electrically conductive layer 81 through the first via hole 83.

In the step S24, the top gate thin film transistor 9 may be specifically formed by the following steps, as shown in FIG. 4(*d*):

Step S241: forming an active layer 94 on the buffer layer 21;

Step S242: forming a gate insulating layer 95 on the active layer 94, and forming a gate electrode 91 on the gate insulating layer 95;

In an example, the gate insulating layer 95 and the gate electrode 91 may be formed by a self-aligned process;

Step S243: removing portions of the gate insulating layer 95 and the gate electrode 91 covering regions of the active layer 94 located at two sides of the channel region, wherein the gate insulating layer 95 may be removed by a dry etching process;

Step S244: processing the regions of the active layer 94 located at two sides of the channel region by an electrical conducting process to form a first electrically conducted region 941 and a second electrically conducted region 942, wherein the electrical conducting process may be performed by dry-etching plasma to process the regions located at two sides of the channel region;

Step S245: forming an interlayer dielectric layer 22 to cover the active layer 94, the gate insulating layer 95 and the gate electrode 91;

Step S246: forming a first via hole 83, a third via 96 and a fourth via 97 in the interlayer dielectric layer 22; forming a source electrode 92 and a drain electrode 93 on the interlayer dielectric layer 22, such that the source electrode 92 is electrically connected to the first electrically conducted region 941 through the third via hole 96, the drain electrode 93 is electrically connected to the second electrically conducted region 942 through the fourth via hole 97, and the drain electrode 93 is electrically connected to the first electrically conductive layer 81 through the first via hole 83.

Step S25: forming a second electrically conductive layer 82 on the interlayer dielectric layer 22 covered by the source electrode 92 and the drain electrode 93, so that the second electrically conductive layer 82 and the first electrically conductive layer 81 form a pixel capacitor 8 therebetween, as shown in FIG. 4(*d*).

The second electrically conductive layer 82 may be formed simultaneously with the source electrode 92 and the drain electrode 93, that is, the interlayer dielectric layer 22 is covered by a source/drain metal layer, and then the source electrode 92, the drain electrode 93, and the second electrically conductive layer 82 are formed by a patterning process.

Step S26: forming a passivation layer 23 on the interlayer dielectric layer 22 to cover surfaces of the source electrode 92, the drain electrode 93 and the second electrically conductive layer 82, as shown in FIG. 4(*d*).

In the method for manufacturing the array substrate provided by the embodiments of the present disclosure, the forming the organic light emitting unit 5 on the planarization layer 4 specifically includes the following steps:

Step S61: forming a second via hole 84 which extends through the planarization layer 4, the passivation layer 23 and the interlayer dielectric layer 22, and is in communication with the first electrically conductive layer 81, as shown in FIGS. 4(c) and 4(d).

The second via hole 84 may be formed by one-time etching after the buffer layer 21, the planarization layer 4, the passivation layer 23, and the interlayer dielectric layer 22 are formed; as shown in FIGS. 4(c) and 4(d), it may also be formed by the following processes: forming the buffer layer 21 on the base substrate 1 and forming a first sub-via hole 841 in the buffer layer 21, the first sub-via hole 841 being communicated with the first electrically conductive layer 81; forming the interlayer dielectric layer 22 on the buffer layer 21 and forming a second sub-via hole 842 in the interlayer dielectric layer 22; forming the passivation layer 23 on the interlayer dielectric layer 22 and forming a third sub-via hole 843 in the passivation layer 23; forming a planarization layer 4 on the passivation layer 23 and forming a fourth sub-via hole 844 in the planarization layer 4; combining the first sub-via hole 841, the second sub-via hole 842, the third sub-via hole 843 and the fourth sub-via hole 844 to form the second via hole 84.

Step S62: forming a transparent electrode 51, at least a portion of which is located on the planarization layer 4, such that the transparent electrode 51 is electrically connected to the first electrically conductive layer 81 through the second via hole 84, and an orthographic projection of the first region 511 of the transparent electrode 51 on the base substrate 1 at least partially overlaps with an orthographic projection of the second electrically conductive layer 82 on the base substrate 1, as shown in FIG. 4(e).

The transparent electrode 51 may be made of a transparent conductive oxide such as ITO, AZO or the like.

The forming the transparent electrode 51 in the step S62 specifically includes the following steps:

Step S621: forming a second opening 41, which extends through the planarization layer 4, in the planarization layer 4, as shown in FIG. 4(d);

The second opening 41 may be spaced apart from the second via hole 84; as shown in FIG. 4(e), it may partially overlap with the second via hole 84.

Step S622: forming the transparent electrode 51 such that the first region 511 covers the passivation layer 23 and is located within the second opening 41, as shown in FIG. 4(e).

The forming the organic light emitting unit 5 on the planarization layer 4 further includes the following steps, as shown in FIG. 4(e):

forming a pixel defining layer 54 on the transparent electrode 51 to form an opening defining a light emitting region; and forming the organic light emitting layer 53 in the opening of the pixel defining layer 54.

The organic light emitting layer 53 may be formed by an evaporation process or may be formed by an inkjet printing process, which is not specifically limited herein.

For the features in the embodiments of the method for manufacturing the array substrate, which are the same as or similar to those of the above-mentioned embodiments of the array substrate, references may be made to the description of the above-mentioned embodiments of the array substrate, and therefore they will not be described herein again.

In the array substrate, the method for manufacturing the same, the display panel and the display device provided by the embodiments of the present disclosure, since the insulating layer is provided with a first opening, and at least a portion of the color filter layer is filled in the first opening, a height difference between the color filter layer and the base substrate is reduced in case where the thickness of the color filter layer is constant, and at least a portion of the color filter layer is overlapped with the insulating layer, thereby greatly reducing the height the portion of the color filter layer protruding from the insulating layer. In this case, it is unnecessary to make the planarization layer too thick, to cover the surface of the color filter layer protruding from the surface of the insulating layer, thus the thickness of the planarization layer can be greatly reduced. The reduction of the thickness of the planarization layer can effectively shorten the light exit path of the light emitted by the organic light emitting unit, and reduce the absorption of the light emitted from the organic light emitting unit by respective film layers, thereby facilitating the improvement of the highest brightness of the light emitted by the organic light emitting unit, and further facilitating the improvement of the contrast ratio of the display device and allowing the user to obtain a better visual experience.

The above description only refers to the specific embodiments of the present disclosure, but the scope of the present disclosure is not limited thereto. Any changes or substitutions that are easily obtained by those skilled in the art within the technical scope of the present disclosure should be covered within the scope of the present disclosure. Therefore, the scope of the present disclosure should be defined by the appending claims.

What is claimed is:

1. An array substrate comprising a plurality of pixels, each of the pixels comprising a plurality of sub-pixels,
    wherein each of the plurality of sub-pixels comprises a base substrate, an insulating layer, a color filter layer, a planarization layer, and an organic light emitting unit,
    wherein the insulating layer covers the base substrate, the insulating layer is provided with a first opening, at least a portion of the color filter layer is filled in the first opening, the planarization layer covers over the insulating layer and a surface of the color filter layer, and the organic light emitting unit is disposed on the planarization layer,
    wherein each of the plurality of sub-pixels further comprises a transparent etching barrier layer between the color filter layer and the base substrate,
    wherein the insulating layer comprises a buffer layer, an interlayer dielectric layer covering the buffer layer, and a passivation layer covering the interlayer dielectric layer, and
    wherein a first sub-opening is provided in the buffer layer, a second sub-opening is provided in the interlayer dielectric layer, and a third sub-opening is provided in the passivation layer.

2. The array substrate according to claim 1, wherein the first opening extends through the insulating layer.

3. The array substrate according to claim 1, wherein the first opening extends into the insulating layer but does not extend through the insulating layer.

4. The array substrate according to claim 1, wherein each of the plurality of sub-pixels further comprises a light shielding layer covering the base substrate, and a top gate thin film transistor, the top gate thin film transistor comprising a gate electrode, a source electrode, a drain electrode, an active layer and a gate insulating layer.

5. A display panel, comprising the array substrate according to claim 1.

6. A display device, comprising the display panel according to claim 5.

7. An array substrate comprising a plurality of pixels, each of the pixels comprising a plurality of sub-pixels,
- wherein each of the plurality of sub-pixels comprises a base substrate, an insulating layer, a color filter layer, a planarization layer, and an organic light emitting unit,
- wherein the insulating layer covers the base substrate, the insulating layer is provided with a first opening, at least a portion of the color filter layer is filled in the first opening, the planarization layer covers over the insulating layer and a surface of the color filter layer, and the organic light emitting unit is disposed on the planarization layer,
- wherein each of the plurality of sub-pixels further comprises a transparent etching barrier layer between the color filter layer and the base substrate,
- wherein each of the plurality of sub-pixels further comprises a light shielding layer covering the base substrate, and a top gate thin film transistor, the top gate thin film transistor comprising a gate electrode, a source electrode, a drain electrode, an active layer and a gate insulating layer,
- wherein each of the plurality of sub-pixels further comprises a pixel capacitor, the pixel capacitor comprising a first electrically conductive layer and a second electrically conductive layer;
- wherein the first electrically conductive layer covers the base substrate, the first electrically conductive layer is electrically connected to the drain electrode, and first electrically conductive layers of two adjacent ones of the plurality of sub-pixels are insulated from each other; and
- wherein the second electrically conductive layer and the drain electrode cover a same layer, and the second electrically conductive layer is electrically connected to the gate electrode.

8. The array substrate according to claim 7, wherein the light shielding layer covers the first electrically conductive layer and is electrically connected to the first electrically conductive layer, and the light shielding layer is electrically connected to the drain electrode.

9. The array substrate according to claim 7, wherein each of the plurality of sub-pixels further comprises a passivation layer covering surfaces of the source electrode, the drain electrode and the second electrically conductive layer; and
- the insulating layer comprises a buffer layer and the passivation layer, the buffer layer covering a surface of the light shielding layer, the planarization covering the passivation layer.

10. The array substrate according to claim 9, wherein the organic light emitting unit comprises a transparent electrode, at least a portion of the transparent electrode covering the planarization layer, the transparent electrode being electrically connected to the first electrically conductive layer, the transparent electrode comprising a first region, and
- wherein an orthographic projection of the first region on the base substrate at least partially overlaps with an orthographic projection of the second electrically conductive layer on the base substrate.

11. The array substrate according to claim 10, wherein the planarization layer is provided with a second opening extending through the planarization layer, and the first region covers the passivation layer and is located in the second opening.

12. The array substrate according to claim 10, wherein the organic light emitting unit further comprises an organic light emitting layer disposed on the transparent electrode and an electrode disposed on the organic light emitting layer.

* * * * *